Nov. 14, 1961 J. R. SHOAF II 3,009,151

STEREOPHONIC RADIO BALANCE AND TUNING INDICATOR SYSTEM

Filed Sept. 28, 1959

INVENTOR.

JAMES R. SHOAF II

BY H. L. Newton

ATTORNEY

United States Patent Office 3,009,151

Patented Nov. 14, 1961

3,009,151
STEREOPHONIC RADIO BALANCE AND TUNING INDICATOR SYSTEM

James Riley Shoaf II, Collingswood, N.J., assignor to Radio Corporation of America, a corporation of Delaware Filed Sept. 28, 1959, Ser. No. 842,665
15 Claims. (Cl. 343—205)

Figures 1, 2:
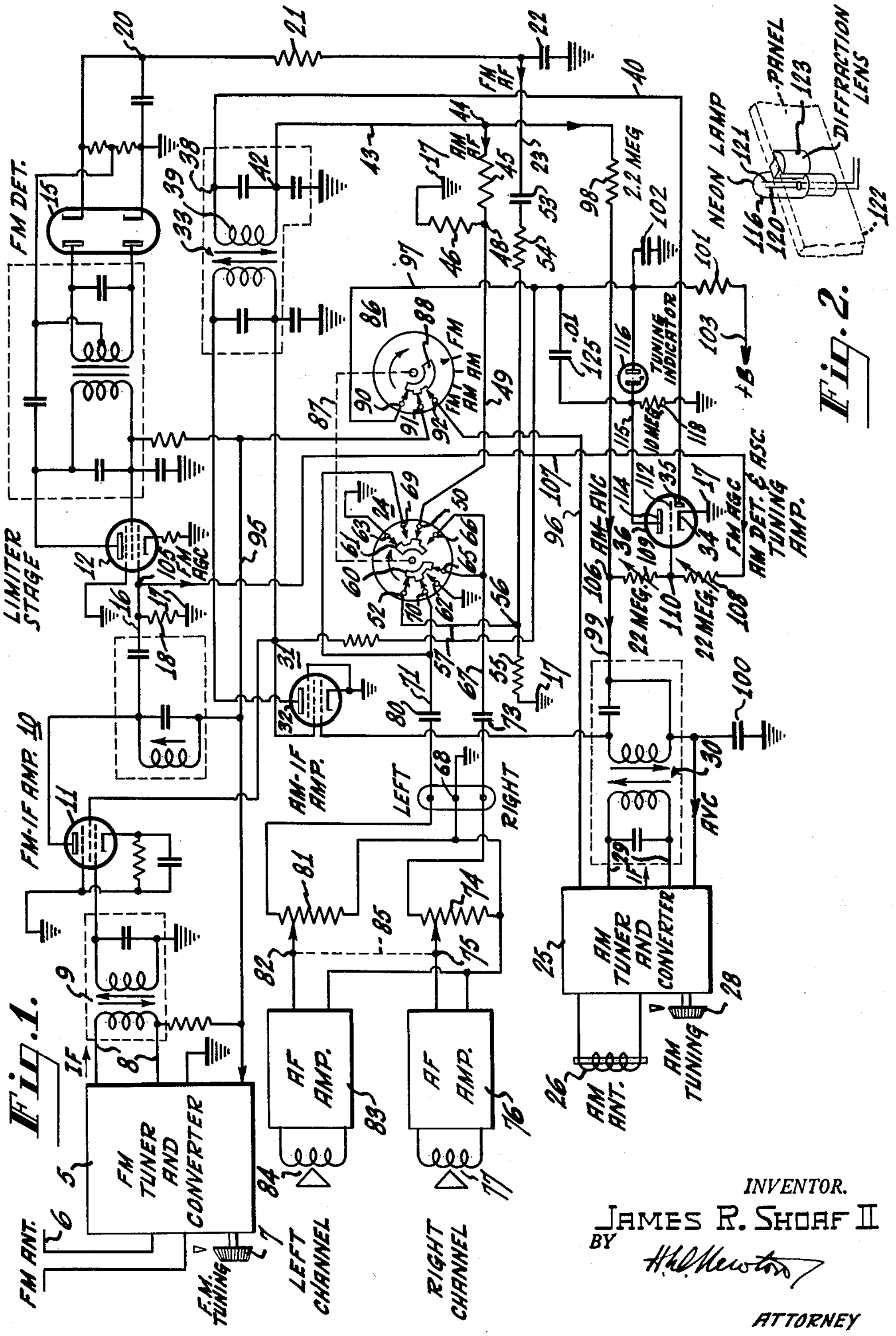

The present invention relates to combined FM-AM and like radio receivers of the type adapted for the reception and reproduction of stereophonic radio broadcast programs. Such stereophonic radio receivers generally provide two signal translating portions or channels with separate audio-frequency amplifier and loudspeaker means for simultaneously reproducing two stereophonically-related (A and B) audio-frequency signals which constitute a single stereophonic broadcast program. In many combined FM-AM stereophonic radio receivers, which are presently used for stereo broadcast reception, each signal receiving portion or channel may be operated respectively as an independent receiver for monophonic AM or FM radio broadcast reception.

The present invention has for an object the provision of an improved tuning indicator system for combined FM-AM radio receivers of the type above referred to, and has for a further object the provision of an improved tuning indicator system for stereophonic FM-AM radio receivers and the like, having improved visual tuning indicator means and control circuit means therefor, which is fully responsive to received single-channel FM and AM, and FM-AM stereophonic, or two-channel, broadcast signals without appreciable circuit change.

It is also an object of this invention to provide an improved and accurate tuning indicator system that can be applied to combined FM-AM radio receivers and the like, for stereophonic signal translation, and that involves the use of a minimum number of low-cost additional circuits and circuit elements.

It is desirable that the levels of reproduced stereo sound from the two receiver channels shall be balanced and maintained in balance throughout a stereo broadcast program regardless of signal strength variations at the receiver in either channel.

Accordingly, it is an object of this invention to provide an improved stereophonic radio receiver having two stereophonic signal translating channels with automatic stereo or channel balance control means, to aid in maintaining a predetermined ratio of sound output between the two channels notwithstanding signal strength variations.

It is, likewise, an object of this invention to provide an improved tuning indicator system for combined FM-AM radio receivers which gives accurate visual tuning indication with a single indicator element for the three modes of operation, FM—AM—Stereo, and automatic channel balance or stereo control for the stereo mode of operation.

In accordance with one aspect of the invention, a first or FM signal-responsive (AGC) control voltage is derived from the FM channel of the receiver, and a second or AM signal-responsive (AVC) control voltage is derived from the AM channel of the receiver. These control voltages are arranged to jointly and individually control a single neon-lamp, a like gaseous-discharge device, as a tuning indicator coupled thereto through a tuning-indicator control amplifier of the D.-C. type. A D.-C. conductive control or coupling-circuit connection is provided between the channel control-voltage sources and the input circuit of the tuning-indicator control amplifier.

In one circuit arrangement, in accordance with the invention, the first control voltage is derived from the FM receiver channel, at a limiter-stage grid circuit in the IF amplifier preceding the FM detector, as the FM signal-responsive control voltage for the tuning indicator system. This control voltage is negative with respect to common or chassis ground for the receiver or system. The second control voltage, also negative with respect to the system ground, is derived from the AVC circuit of the AM audio detector, as the AM signal-responsive control voltage. The FM control voltage source, or limiter grid circuit, is D.-C. conductively connected to the AVC circuit of the AM receiver channel or AM control voltage source, through relatively high resistance means provided by two effectively series-connected resistor portions or sections, between which is connected the input or control electrode of the control amplifier device. Additionally, the device may have the usual output electrode or plate and common electrode or cathode, with the latter connected to the chassis or system ground. In a practical receiver of the present type, this amplifier device may be the triode portion of the usual AM electronic detector tube, which normally utilized only the diode portion of the tube. Thus no additional amplifier tube or device is required for the tuning indicator control amplifier.

In the output anode circuit of the control amplifier, a gaseous-discharge device, such as a neon lamp, is connected as an indicator device and mounted in association with an elongated curved diffraction lens, the axis of which is parallel to the spaced rod-like lamp electrodes. The lens is mounted in the receiver panel or like masking means. When viewed through the lens, the neon lamp provides a light area between the electrodes that appears to extend and contract longitudinally along the lens and change in brightness, in response to changes in the signal-responsive control voltage applied thereto through the control amplifier.

The circuit arrangement is such that the lamp dims and the light area decreases in length as a signal is tuned in. Tuning resonance is indicated when the flow of current through the tuning indicator lamp is minimum. Small changes in the degree of brightness or light intensity at low illumination levels are more apparent and easier to see, and therefore provide accurate tuning indication.

When both the FM and AM portions of the receiver are in operation to receive two signals simultaneously, such as stereophonic FM-AM broadcast program signals, the control amplifier circuit, in connection with the D.-C. conductive connection provided between the FM limiter grid circuit and the AM AVC circuit, operates to provide a considerable degree of automatic stereophonic balance control in the reproduction of the signals from both channels. By this means, the sound output from the AM channel is substantially automatically maintained in predetermined balance with the sound output from the FM channel when operating in the stereo mode.

The total series resistance of the two resistor sections, or the equivalent thereof, in the D.-C. conductive connection between the FM limiter grid circuit and the AVC circuit in the AM channel is made sufficiently high to prevent crosstalk between the channels.

The relative resistance values of the two sections, of any resistive means of whatever type used, are preferably such that the control amplifier, when connected at effectively the junction of the resistor sections, may operate to provide balanced AM and FM tuning indication, that is, the same degree of dimming of the neon-indicator lamp when either an AM or an FM signal is tuned in for a stereo broadcast program.

Means are also provided in the receiver for selectively de-energizing either of the signal channels, preceding the limiter stage or control-voltage take-off point in the FM channel and preceding the second detector or control-voltage take-off point in the AM channel, whereby each channel may be separately tuned in on the tuning indicator. For the stereo mode of operation, where both control voltages are applied, the weaker station or channel may be tuned in first.

The invention will further be understood from the following description of a practical embodiment thereof, with reference to the accompanying drawing, and its scope is pointed out in the appended claims.

In the drawing, FIGURE 1 is a schematic circuit diagram of an FM-AM radio receiver provided with a stereophonic radio balance and tuning indicator system embodying the invention, and FIGURE 2 is a view, in perspective, of a portion of the system of FIGURE 1, showing structural details of a tuning indicator device as provided therein, in accordance with the invention.

Referring to the drawing, a dual-channel or stereo radio-signal receiver of present conventional form is shown, by way of example, to which the tuning indicator system of the present invention is applied for the reception of both FM-AM stereophonic, and individual monophonic FM and AM, broadcast programs. The receiver includes an FM tuner 5 connected with a suitable FM antenna 6 and having manual tuning control means, indicated by a tuning knob 7, by which it is tuned through the FM tuning band for the selection of carrier signals received on the antenna 6.

The tuner 5 includes any suitable FM tuning and signal-translating means, including a converter, for deriving a desired intermediate-frequency (IF) signal. The intermediate-frequency signal output circuit 8 of the converter is connected, through an intermediate-frequency coupling transformer 9, with an intermediate-frequency amplifier 10 comprising any suitable number of amplifier stages. These are represented by an electron-tube amplifier stage 11 and an electron-tube limiter stage 12 preceding the FM detector 15, the circuit of which is of the well known Foster-Seeley discriminator type. The limiter stage 12 has a tuned input grid circuit 16 connected to common ground or chassis 17 for the system through a grid resistor 18. This is of relatively low resistance such, for example, as 470,000 ohms for use with a tube of the commercial 12AU6 type shown.

The signal output terminal of the FM detector 15, indicated at 20, is connected through a de-emphasis network, comprising a series resistor 21 and a shunt by-pass capacitor 22, to a signal output lead 23 from which the FM audio-frequency signals are taken, for utilization in one or both audio amplifier channels of the receiver, through a selector switch 24 as will hereinafter be described.

The AM channel of the receiver includes a suitable AM tuner and converter 25 provided with a ferrite loop or other suitable antenna 26 and individual tuning control means, for manual tuning through the broadcast band, represented by a tuning knob 28. The tuner and converter 25 may include any suitable, known signal receiving and translating circuits for converting incoming carrier signals, received on the antenna 26, into corresponding IF signals at an output circuit 29 which is connected through an IF coupling transformer 30 to an intermediate-frequency amplifier 31, comprising a single amplifier tube 32 in the present example. An IF coupling transformer 33 is connected to a diode second, or audio, detector comprising the cathode 34 and an associated anode electrode 35 of a combined diode-triode tube 36.

The connection between the IF output transformer 33 and the AM detector diode 34—35 may be traced from the high potential terminal 38 of the tuned secondary 39 of the transformer through an output lead 40 to the diode anode 35 in the tube 36. From the low-potential terminal 42 of the secondary 39, an output lead 43 is connected with a detector output terminal 44 from which both AM audio-frequency and AVC potentials are derived. From the terminal 44 a connection is provided through the diode load-resistor means comprising a resistor 45 and a resistor 46 connected in series to ground 17. The cathode 34 is connected to ground 17, thereby completing the diode circuit through the load resistors 45 and 46.

The audio-frequency signal component of the rectified AM signal at the detector output terminal 44 is derived from an output terminal 48 between the load resistors 45 and 46 which thus provide a signal voltage divider. The audio-frequency signal component of the AM signal from the detector output terminal 48 is conveyed through a connection lead 49 to the selector switch 24 and a fixed switch contact 50 therein. Likewise the audio-frequency signal component of the FM signal at the output lead 23 is conveyed therefrom to a fixed contact 52 of the selector switch 24 through a coupling capacitor 53 and signal voltage divider means comprising two resistors, 54 and 55, connected in series to ground 17 for the system, and having a tap connection 56 therebetween connected with the contact 52 through a connection lead 57.

The switch 24 represents any suitable selector switch means for connecting the FM and AM detector output circuits to the respective left and right channel audio-frequency amplifying and reproducing elements of the receiving system for stereo signal reception and reproduction, or each selectively to both channels, independently of the other, for monophonic signal reception and reproduction. It is thus the operating-mode selector switch for the two-channel receiver. In the present example, the switch is shown in a first of three positions, from which it is moved clockwise, and in this first position connects the FM audio output circuit 23 through the voltage divider 54—55 to both audio-frequency amplifying and reproducing channels of the receiver for monophonic FM signal reception.

For a better understanding of the circuit switching provided, the contact arrangement of the switch 24 will briefly be described. The switch is provided with two jointly-rotatable or movable contact elements 60 and 61 having a configuration for engaging and connecting with the various fixed contacts. In addition to the contacts 50 and 52 previously referred to, these include two grounded contacts 62 and 63, a pair of contacts 65 and 66 connected to a right-channel audio-frequency supply circuit lead 67, and a second pair of contacts 69 and 70 connected to a left-channel audio-frequency supply circuit lead 71, for both of which leads a common ground or chassis return connection is provided at a terminal 68. The signal supply circuit provided by the lead 67 and ground is connected to the right or AM channel audio-frequency amplifier means of the receiver, and the signal supply circuit provided by the lead 71 and ground is connected to the left or FM channel audio-frequency amplifier means of the receiver. The switch 24 provides different modes of signal supply to the amplifier means through these circuits for the three modes of operation.

Specifically, the signal supply lead 67 is connected, through a coupling capacitor 73 and volume-control means represented by a potentiometer 74 having a movable contact 75, to a right channel audio-frequency amplifier 76 which, in turn, is connected to the right channel sound reproducing means or loadspeaker 77. In a similar manner, the signal supply lead 71 is connected through a coupling capacitor 80 and a volume-control potentiometer 81, having a movable contact 82, with a left channel audio-frequency amplifier 83 which, in turn, is connected to the left channel sound reproducing means or loudspeaker 84. The volume control potentiometers represent any suitable means for controlling the volume of the sound output from the two channels, and are operated in unison for joint control of the sound volume on both channels, as indicated by the dotted line connection 85 between the movable contacts 75 and 82.

Referring to the switch 24 it will be seen that, in the first or full counterclockwise position shown, the contact element 60 serves to connect the contacts 52, 70 and 65 together, thereby providing a connection from the FM detector output circuit 23 to both signal supply circuit leads 67 and 71, and therefore to both sound or audio-frequency amplifying and reproducing channels in parallel, for monophonic signal reproduction from FM programs. In this position of the switch, the movable contact element 61 serves to connect the fixed contacts 50 and 63 together, thereby grounding the output circuit 49 from the AM detector to cut off sound reproduction therefrom.

For the next or intermediate position of the switch 24, in which the movable contact elements 60 and 61 are advanced one position clockwise, the contact element 60 serves to connect the fixed contacts 52 and 62 together. The FM detector output circuit 23 thus is grounded through the connection lead 57, and the AM output circuit 49 is connected, through the fixed contacts 50, 66 and 69 and the movable contact 61, to both supply leads 67 and 71 in parallel, and therefore to both sound or audio-frequency amplifying and reproducing channels in parallel, for monophonic signal reproduction of AM programs.

For the third or full clockwise position of the switch 24, with the movable contacts 60 and 61 advanced two positions from that shown, the AM detector output lead 49 is connected to the right sound-channel supply circuit lead 67 and the FM detector output lead 23 is connected through the lead 57 with the left sound channel supply lead 71, without any connection between the two channels. In this position of the switch, the two receiver channels are separate and independent for full stereophonic signal reception and reproduction, the left channel stereo signal component being translated through the FM receiver portion and the speaker 84, and the right channel stereo signal component being translated through the AM receiver portion and the speaker 77.

A combined FM-AM stereo receiver having separate audio-frequency amplifying and reproducing channels and selective switching means for monophonic FM and AM operation with the two channels in parallel, as well as independent and separate for two-channel stereo operation, is shown by way of example as being the type of receiver for which the present invention is particularly adapted as a tuning and stereophonic balance control aid. As described above, such receivers may operate in three different modes, in two of which the one or the other of the receiver portions is not in use and may be de-energized. It is desirable, therefore, to provide means for controlling the energization of the two signal channels jointly with the channel output switching, whereby both channels or either channel selectively may be energized. Thus the AM channel is de-energized or rendered ineffective for the reception or translation of signals when the FM channel is in operation monophonically, and the FM channel is de-energized or rendered ineffective for the reception or translation of signals when the AM channel is in operation monophonically.

In a practical receiver, having a circuit as shown in the drawing, a second selector switch 86, similar to the switch 24, is gang-coupled for joint operation therewith, as indicated by the dotted line connection 87, to selectively de-energize the one or the other of the receiver portions sufficiently to prevent signal flow therethrough. In the switch 86, a movable contact element 88, shown in its full counterclockwise position, moves clockwise, in unison with the contact elements 60 and 61 of the switch 24, to connect three fixed contacts, 90—91—92, together or in pairs, 90—91 or 90—92, in a circuit arrangement for controlling the application of operating current or voltage to certain of the plate and screen grid circuits of the RF and/or IF amplifiers of the two receiver portions of the system. In the present example, an operating current supply lead 95 in the FM receiver portion, and an operating current supply lead 96 for the AM tuner and converter portion of the receiver, are connected respectively with the fixed contacts 91 and 92 of the switch 86. The fixed contact 90 is connected with a positive supply lead 97 for the amplifier circuits. This, in turn, is connected through a series filter resistor 101 having a shunt filter capacitor 102, with a +B power supply circuit 103 of the receiver, and for which the negative terminal is chassis or common ground 17.

As will be seen from an inspection of the switch 86 and its contact arrangement, in the FM operating position shown, operating current from the positive supply lead 97 is conducted through the contact 90 and the movable contact element 88 to the fixed contact 91, and thence to the supply lead 95 in the FM portion of the receiver, thereby to energize the plate and screen-grid circuits which are connected therewith as shown, and like circuits (not shown) in the FM tuner and converter 5. In this position, the FM portion of the receiver is energized and made operative to receive signals. At the same time, the contact 92 of the switch 86 is open-circuited thereby de-energizing the supply lead 96 and similar circuits (not shown) in the AM tuner and converter 25 connected therewith. AM input signals are therefore cut off from the second detector 34—35, and the audio-frequency and rectified signal voltage at the terminal 44 will effectively be zero.

Similarly, when the movable switch contact 88 is advanced for the AM or mid-position of the switch 86, the fixed contacts 90 and 92 are connected through the movable contact element 88, and the contact 91 is disconnected, thereby to energize the AM portion and to de-energize the FM portion of the receiver, or render it inoperable to transmit signals to the limiter stage 12 and the FM detector 15. Therefore no signal output will be provided at the FM detector output terminal 20, or at the limiter-stage grid circuit 16, when operating monophonically on AM signals only. When the switch 86 is advanced clockwise with the switch 24, to the third or stereo position, for stereo AM and FM signal reception and reproduction, it will be seen that the supply contact 90 is then connected with both fixed contacts 91 and 92 through the movable contact element 88, thereby energizing both supply leads 95 and 96, and the respective signal channels then operate for full two-channel or stereophonic signal reception and reproduction.

In a typical stereo signal receiving system as shown, with separate and independent radio receiving and reproducing channels, automatic gain or volume control of the output audio-frequency signal level, with varying input signal strength or amplitude, is provided in the FM channel preferably by the limiter stage 12, which amplitude-limits signals applied to the FM detector 15. In performing this amplitude limiting, a signal-responsive, or signal-amplitude-responsive, variable negative control voltage is developed at the limiter grid circuit 16 with respect to ground or chassis, across the relatively low resistance load or grid resistor 18. This voltage will hereinafter be referred to as the FM automatic-gain-control or AGC voltage.

In the AM channel of the receiver, automatic gain or volume control of the signal output amplitude at the audio-frequency circuit, with varying signal strength or amplitude, is provided by the rectified signal voltage available from the audio or second detector 34—35, which is a diode rectifier in the present example. This rectified signal voltage is derived from the diode or detector output terminal 44 across the diode or detector output load resistor means 45—46, through filter means comprising a shunt filter capacitor 100 and a series high-resistance filter resistor 98 connected with the AVC control lead 99 of the AM channel. The resistor 98 for this circuit may have a resistance of 2.2 megohms, for example, and the capacitor 100 may have a value of .047 mfd. The signal-variable negative control voltage thus provided in the AM channel or receiver portion will be referred to hereinafter as the AM automatic-volume-control or AVC voltage, to distinguish it from the signal-variable control voltage which is available at the grid circuit 16 of the FM limiter stage 12. The AVC voltage from the lead 99 is applied to the AM IF amplifier 31 and to the AM tuner and converter 25 to control the signal gain as is well understood.

In a dual-channel or stereophonic receiver of the type shown, it will thus be seen that the limiter grid circuit 16 of the FM channel may provide a reliable source of FM automatic-gain-control or AGC voltage which is responsive to FM signal strength or amplitude variations, and is negative with respect to ground or chassis. Normally, this voltage in the receiver circuit shown, may vary from one volt or less to as much as fifty volts in some cases, with variations in applied FM signal strength. Likewise the AVC control lead 99 readily provides a reliable source of AM automatic-volume-control or AVC voltage which is responsive to AM signal strength variations, and likewise is negative with respect to ground or chassis. Normally, in the circuit shown, this voltage may vary from one volt or less to as much as fifteen volts negative with variations in applied AM signal strength.

These control voltages are applied to the triode section of the amplifier tube 36 through the D.-C. conductive connection which is provided, in the present example, between a suitable supply point or terminal 105 on the limiter grid circuit and a suitable supply point or terminal 106 on the AVC circuit or lead 99 by a connection lead or circuit 107 in which are connected two series resistor elements 108 and 109, each having a relatively high resistance value. Either or both resistors may be variable, as indicated, although fixed resistors, each having a relatively high value of about 22 megohms, have been found to be practical for this circuit. An intermediate tap or terminal 110 is provided on this resistive D.-C. connection between the signal channels to which is connected the control amplifier 36 and the single tuning indicator means for the system. This tap connection is conveniently made between the two series-connected resistors, although a single resistor, of equivalent total resistance value, with a variation tap or contact connection thereon may be used.

With this circuit arrangement, the intermediate terminal 110 on the resistor means 108—109 provides, with respect to the signal conveying circuits of both channels, a highly decoupled common source of bias or control voltage which is, however, D.-C. conductively connected with both signal channels for tracking the channel gain and for operating the tuning indicator circuit and tuning indicator at all times. The terminal 110 thus receives signal-responsive negative control voltages from either or both receiver portions or channels without switching, as the one or the other, or both, of the channels are energized to receive signals.

The high-impedance control grid 112 of the amplifier tube 36 is connected directly to the terminal 110, and since the cathode 34 is connected to ground or chassis, the negative control voltage at the terminal 110 serves to bias the amplifier tube toward plate-current cut-off, as it increases negatively in the presence of a received signal in either receiver channels. The anode or plate 114 of the triode section of the tube 36 is connected with the supply lead 97 through a plate circuit 115 which includes the neon indicator lamp 116 serially therein as the plate-circuit load means. Thus current through the lamp decreases and the illumination from the lamp is reduced as a signal is tuned in.

In a radio receiver in which the audio detector of the AM channel may be arranged as the diode portion of a diode-triode tube, as in the present example, the triode portion may be used as the control amplifier. No additional amplifier device is then required.

It will be noted that a load resistor 118 is connected between the plate circuit 115 and chassis or ground as shown, in shunt relation to the plate circuit at the plate, whereas the lamp is in series relation to the plate circuit. This resistor may have a resistance of 10 megohms with a neon indicator lamp 116 of the type known commercially as an NE–51 tube, and provides sufficient residual operating current through the lamp from the supply lead 97 to maintain the lamp conducting slightly when the triode control amplifier is substantially biased to cut off, as it may be in the presence of strong signals.

As shown in FIGURE 2, the neon lamp 116 is further preferably of the type having two parallel-rod-like electrodes 120 and 121 in close substantially-parallel spaced relation to each other within and extending axially of the evacuated envelope of the lamp, and between which the discharge takes place increasingly with applied voltage to provide illumination which increases in intensity or brightness and in length. The lamp is preferably placed behind the front panel 122 of the receiver, indicated in dotted fragmentary outline, in which is mounted an elongated convex or curved diffraction lens 123, the longitudinal axis of which is substantially parallel with the electrodes 120 and 121, so that the illumination viewed through the lens is enlarged or enhanced and appears to extend farther along the lens as the voltage increases between the electrodes.

In the absence of an applied signal, the control amplifier tube with draw sufficient plate current to cause the indicator lamp to glow brightly. The brightness and length of the discharge or illumination between the electrodes decreases as a station is tuned is, so that final sharp tuning may be obtained more effectively as hereinbefore described. Under strong signal conditions, the increased control voltage further causes the light from the tuning indicator lamp 116 to pulsate at a visible rate in response to plate-circuit current variation, the frequency of which is preferably maintained substantially below audibility, and in the range of visibility, by a capacitor 125 which is connected across, or in shunt relation to, the indicator lamp 116 and thus to the plate circuit, between the +B plate supply lead 97 and the high potential terminal of the shunt load resistor 118. Within this range of signal strength variation, the system operates to provide a high degree of stereophonic balance control between the two channels.

Considering first a condition of operation when the received stereo FM signal is stronger than the received stereo AM signal: it may be assumed that the control amplifier tube 36 may be driven into a condition of low plate current, approaching cut-off, by the bias voltage supplied from the FM channel. Under this cut-off or near-cut-off condition, the plate voltage of the tube rises and apparently causes reverse grid current to flow through the high resistance in the grid circuit. In other words, this condition of operation apparently results in reverse grid current flow in the relatively high resistance (22 megohm) grid resistors 108 and 109, the AVC filter resistor 98, and the diode load resistors 45 and 46. This causes a reduction of the normal AVC voltage at the AVC lead 99. A reduced value of AVC voltage causes an increase of gain in the controlled tubes in the converter 25 and the AM IF amplifier 31 of the AM channel, thereby tending to balance the AM channel sound output with that of the FM channel.

Considering now that the AM signal is stronger than the FM signal, the same condition occurs in the control amplifier circuit, but in this case the reduced plate current of the AVC controlled tubes (e.g. tube 32 and those in the AM tuner and converter 25) results in an increase of the B+ supply voltage. This increased B+ supply voltage applied to the FM channel results in a compensating or balancing gain in the FM channel. Any tendency for gain in the AM channel in this way is compensated by the AVC control.

The tuning of the two channels is preferably done separately for stereophonic signal reception, with the switches 24 and 86 set in the one and then the other of the first and second positions for FM or AM reception individually. In this way the control amplifier 36 and the neon indicator 116 are made selectively responsive to one and then the other of the two received signals. Where adjustment is provided for the position of the terminal 110 with respect to the total resistance of the series coupling resistors 108 and 109 for the two circuits, as by changing the relative resistance values of the two resistors for the same total resistance value, equal dimming of the neon lamp at tuning resonance, as referred to hereinbefore, may be obtained for both channels. This adjustment may require a change in resistance between the two resistors 108 and 109 such that the resistor 109 may have a value of 10 megohms and the resistor 108 may have a resistance of 34 megohms, for example. Generally, however, it has been found that for normal operation they may have substantially the same value, such as 22 megohms, as hereinbefore described, and a high degree (44 megohms) of signal decoupling between channels so that cross-talk is effectively prevented.

When a stereophonic FM-AM radio broadcast program is tuned in as above described, and the mode selector switch is then turned to the third position, for full stereophonic or two-channel reception with both receiver channels energized, because of the control amplifier and neon-lamp circuit connections between the AGC and AVC circuits, the sound output levels from the two channels at the speakers tend to equalize and thereby enhance the stereo effect. The tuning indicator system thus provides improved visual tuning indication and stereo balance control of the two channels of the receiver, and at relatively low cost. Furthermore, crosstalk between the two channels is substantially eliminated without sacrificing the desired amount of control for effective tuning indication and stereo balance control, and the tuning indication and stereo balance control circuits require no switching for the different modes of operation of the receiver.

What is claimed is:

1. In a dual-channel stereophonic radio signal receiver, the combination with frequency-modulation signal receiver means and amplitude-modulation signal receiver means, of a control amplifier having an input circuit coupled jointly to a signal-responsive control-voltage supply point in each of said signal receiver means through relatively high-resistance coupling means, a variable-current output circuit for said amplifier responsive to control voltage variations from said supply points and including a neon lamp element variably operable in response to variations in current flow therethrough, controlling capacitance means for said amplifier connected in shunt relation to said neon lamp element, and means for energizing said receiver means for stereophonic signal reception.

2. A control system for use with radio signal receivers having two stereophonic signal translating channels, comprising in combination, means for deriving a control voltage from each of said channels which is responsive to the strength of the applied signal therein, a direct-current amplifier having an input circuit connected between said voltage-deriving means and having a variable-current output circuit responsive to control voltage variations at said input circuit, a gaseous-discharge device connected in said output circuit for operation in response to output current variations, capacitance means connected with said device for controlling the operation thereof, and load resistance means connected with said output circuit to provide residual current flow through said device.

3. A control system for use with radio signal receivers having two stereophonic signal translating channels, comprising in combination, means for deriving at separate terminals a signal-responsive variable gain-control voltage from each of said channels with respect to common ground for said receiver, means providing a relatively-high-resistance direct-current conductive circuit connection between said terminals, a direct-current amplifier having an input circuit connected between a tap point on said high-resistance connection means and said common ground, a variable-current output circuit for said amplifier responsive to voltage variations at said input circuit, a gaseous-discharge device connected in said output circuit to operate in response to current variations therethrough, capacitance means connected with said device for controlling said current variations, and load resistance means connected with said output circuit to provide residual current flow through said device.

4. In a radio receiver having two signal channels for the translation and reproduction of two stereophonically-related sound signals providing a single broadcast program, a channel balance control system comprising in combination, means in each of said signal channels providing a source of control voltage the amplitude of which is a function the signal amplitude therein, means providing a control circuit connected between said voltage sources, series relatively-high resistance means in said circuit, a control amplifier having an input circuit connected with said control circuit at an intermediate point on said reistance means thereby to receive control voltage from each of said signal channels in response to received signals, an output circuit for said amplifier providing variable operating current in response to variations in said voltage, and means including a source of operating voltage connected to said output circuit for controlling the operation of said amplifier in response to relatively wide variations in the control voltage from at least one of said sources for aiding in maintaining a desired amplitude relationship in the sound signal output from said signal channels.

5. In a combined FM-AM radio signal receiver having tunable FM and AM signal channels adapted for two-channel stereophonic signal reception and reproduction, a stereophonic channel balance control system comprising in combination, means for deriving a signal-responsive variable gain-control voltage from each of said channels with respect to common ground for said receiver, a control amplifier having an input circuit connected with said last named means, an output circuit for said amplifier responsive to voltage variations at said input circuit to provide a variable output current, a gaseous-discharge lamp connected in said output circuit for operation by said current, shunt capacitance means connected with said lamp for controlling oscillatory currents in said amplifier output circuit incidental to the operation of said lamp, shunt load resistance means connected with said output circuit to provide residual current flow through said lamp, and means for jointly energizing said signal channels to provide operation of said system.

6. In a dual-channel stereophonic radio signal receiver, the combination with frequency-modulation signal receiver means and amplitude-modulation signal receiver means, of a tuning control direct-current amplifier device having a high-impedance input circuit coupled jointly to a signal-amplitude-variable voltage supply point in each of said signal receiver means through relatively high-resistance coupling means, a variable-current output circuit for said amplifier device responsive to variations in applied signal-amplitude-variable voltages from said supply points, a neon tuning indicator lamp connected in said output circuit and responsive to variations in current flow therethrough to provide related visible light variations, diffraction lens means mounted in relation to said lamp for enhancing the visibility of said light variations, means providing a relatively-high resistance load in shunt relation to said output circuit for drawing residual operating current through said neon lamp, means providing controlling capacitance in shunt relation to said neon lamp, and means for energizing said receiver means for stereophonic signal reception.

7. In a dual-channel stereophonic radio signal receiver, the combination as defined in claim 6, wherein the voltage supply point in the frequency-modulation receiver means is an intermediate-frequency amplifier limiter-stage grid circuit and the voltage-supply point in the amplitude-modulation receiver means is an automatic-volume-control circuit connected with the second detector thereof.

8. In a dual-channel stereophonic radio signal receiver, the combination as defined in claim 6, wherein the voltage supply point in the frequency-modulation receiver means is an intermediate-frequency amplifier limiter-stage grid circuit and the voltage-supply point in the amplitude-modulation receiver means is an automatic-volume-control circuit connected with the second detector thereof, and wherein the amplifier device is the triode section of an electronic diode-triode tube of which said second detector is the diode section.

9. A tuning indicator and stereophonic balance control system for use with radio receivers having two signal channels adapted for stereophonic signal translation, comprising in combination, means including a terminal connection in each of said signal channels providing a signal-responsive variable direct-current control voltage, means providing a relatively high-resistance direct-current conductive circuit between said terminal connections, a direct-current amplifier having a high-impedance input circuit connected between common ground for said system and an intermediate point on said high-resistance circuit means thereby to receive a variable controlling voltage from each of said signal channels in response to applied signals, an output circuit for said amplifier providing variable operating current in response to variations in said voltages, a neon lamp connected serially in said output circuit and responsive to operating current variations for providing visible tuning-indication light variations therefrom, capacitance means connected in circuit with said neon lamp for establishing a low-frequency oscillatory condition of operation of said amplifier in response to increased control voltage amplitude and pulsations in the light from said lamp at a frequency within the range of visibility, and means for energizing said signal channel for stereophonic signal translation.

10. A tuning indicator and sterophonic balance control system for use with combined FM-AM sterophonic radio receivers having two tunable and simultaneously-operable signal translating and reproducing channels, comprising in combination, means including a supply terminal in each of said signal channels providing signal-responsive direct-current control voltages of which one is an amplitude-modulation-signal-derived automatic-volume-control voltage and the other of which is a frequency-modulated-signal-derived automatic-gain-control voltage, means providing a relatively high-resistance direct-current conductive connection between the respective channel control voltage supply terminals, an electronic-tube amplifier device having a high-impedance input circuit connected between common ground for said system and an intermediate point on said high-resistance connection means thereby to receive controlling voltages jointly from said supply terminals while being effectively decoupled therefrom for signal transfer, an output plate circuit for said amplifier device having a positive plate-supply connection and providing a variable plate current in response to variations in said control voltages, a neon indicator lamp connected in said plate circuit and responsive to plate-current variations for providing related visible light variations therefrom, load resistance means connected in shunt relation to said plate circuit providing residual operating current through said lamp, capacitance means connected in shunt relation to said neon lamp for establishing a low-frequency oscillatory condition of operation of said amplifier device in response to increased control voltage amplitude and pulsations in the light from said lamp at a frequency within the range of visibility, and means for selectively energizing said signal channels for individual channel tuning indication and operation, and for stereophonic signal translation and reproduction.

11. In a dual-channel stereophonic radio signal receiver, the combination with frequency-modulation signal receiver means having an intermediate-frequency amplifier limiter stage and amplitude-modulation signal receiver means having an amplitude-modulation signal rectifier and an automatic volume control circuit connected therewith, of a tuning control direct-current amplifier device having a high-impedance input circuit coupled jointly to a signal-responsive control voltage supply point in each of said limiter amplifier stage and said automatic voltage control circuit through relatively high-resistance coupling means, a variable-current output circuit for said control amplifier responsive to control-voltage variations from said supply points, a neon tuning indicator lamp having two spaced rod-like electrodes responsive to variations in current flow through said output circuit to provide visible light of related varying intensity and length therebetween, an elongated convex diffraction lens means mounted with the longitudinal axis thereof in substantially parallel relation to said lamp electrodes for enhancing the visibility of the light variations therefrom, a relatively high resistance load resistor connected in shunt relation to said output circuit for maintaining residual operating current through said neon lamp, a controlling capacitor connected in shunt relation to said neon lamp, means for energizing said receiver means for stereophonic signal reception, and means for selectively energizing each of said receiver means for adjusting the tuning of each receiver means in accordance with said light variations of the tuning indicator lamp.

12. In a combined frequency- and amplitude-modulation stereophonic radio signal receiver having separate tunable frequency-modulation and amplitude-modulation signal receiving channels with individual audio-frequency amplifying and reproducing means and selective switching means for monophonic frequency-modulation and amplitude-modulation signal reception with said amplifying and reproducing means in parallel and for independent two-channel stereophonic signal reception with said amplifying and reproducing means separate and individual to said channels, a tuning indicator and automatic stereo balance control system therefor comprising in combination, means including a limiter-stage grid circuit in the frequency-modulation channel for deriving a first signal-amplitude-responsive control voltage, means including an automatic-volume-control circuit in the amplitude-modulation channel for deriving a second signal-amplitude-responsive control voltage, means including a pair of series-connected resistors providing a relatively high resistance connection between said limiter stage grid circuit and said automatic-volume-control circuit, an electronic tube amplifier device having a control grid connected to the junction of said resistors and having a cathode electrode connected with ground for said system, said amplifier device having a plate electrode and an output plate circuit connected therewith, a neon indicator lamp connected serially in said plate circuit and having a shunt controlling capacitor connected therewith, means for supplying plate current to said amplifier tube through said neon indicator lamp, a relatively high resistance plate-circuit load resistor connected between the plate electrode and ground for said system, said amplifier device being thereby individually responsive to said control voltages to control the neon-lamp current and the lamp illumination for effective tuning indication, and jointly responsive thereto for enhancing the channel stereo balance in response to relatively high control voltages.

13. In a combined frequency- and amplitude-modulation stereophonic radio signal receiver, a tuning indicator and automatic stereo balance control system as defined in claim 12 wherein, the neon indicator lamp includes two spaced elongated electrodes, and wherein an elongated curved diffraction lens is mounted in axially-parallel relation to the neon lamp and said electrodes for enhancing the illumination therefrom.

14. In a radio receiver having frequency-modulation and amplitude-modulation signal translating and reproducing channels for stereophonic signals including an intermediate-frequency amplifier limiter stage having a grid circuit and a grid-circuit shunt load resistor in the frequency-modulation channel and a diode second detector having an automatic volume control circuit connected therewith in the amplitude-modulation channel, of a tuning indicator and automatic stereophonic balance control system therefor comprising in combination, terminal means for deriving a first signal-responsive variable control voltage from the frequency-modulation channel at the grid end of the limiter stage grid-circuit load resistor, terminal means for deriving a second signal-responsive variable control voltage from the amplitude-modulation channel at the automatic volume control circuit of the second detector, an electronic-tube tuning control amplifier comprising the triode section of a diode-triode amplifier tube of which the diode portion is said second detector, means including a pair of series-connected resistor elements providing a high-resistance direct-current conductive connection between said terminal means, means providing a control-grid connection for said control amplifier with the junction of said series-connected resistor elements, means providing an output plate circuit for said amplifier having a power-supply connection, a neon lamp connected serially in said output circuit whereby the space discharge resulting from plate current flow therethrough provides a variably elongated illumination pattern, means providing a capacitive and a resistive load for said neon lamp in connection with said plate circuit for controlling the operation thereof for enhanced stereophonic channel balance in the region of low plate current resulting from strong stereophonic signals and increased amplitude of said control voltages, means for selectively energizing each of said signal channels for selective tuning indication through said indicator lamp, and means for jointly energizing said channels for stereophonic signal reception and reproduction.

15. In a radio receiver, a tuning indicator and automatic stereophonic balance control system as defined in claim 14, wherein the neon lamp comprises a pair of rod-like electrodes in parallel relation to each other along the axis of the lamp and between which the space discharge takes place to produce said variably elongated illumination pattern, and wherein an elongated curved diffraction lens is mounted substantially axially-parallel with said electrodes providing an enhanced view of said illumination pattern.

References Cited in the file of this patent

UNITED STATES PATENTS

| | | |
|---|---|---|
| 2,318,338 | Simon et al. | May 4, 1943 |

FOREIGN PATENTS

| | | |
|---|---|---|
| 460,198 | Great Britain | Jan. 22, 1937 |
| 528,061 | Great Britain | Oct. 22, 1940 |